United States Patent
Grehan et al.

(10) Patent No.: US 10,418,849 B2
(45) Date of Patent: Sep. 17, 2019

(54) SYSTEMS AND METHODS FOR MONITORING A CONFIGURATION OF UPS GROUPS WITH DIFFERENT REDUNDANCY LEVELS

(71) Applicant: SCHNEIDER ELECTRIC IT CORPORATION, West Kingston, RI (US)

(72) Inventors: David Grehan, Claremorris (IE); Sarah Jane Hannon, Ennis (IE)

(73) Assignee: SCHNEIDER ELECTRIC IT CORPORATION, West Kingston, RI (US)

( * ) Notice: Subject to any disclaimer, the term of this patent is extended or adjusted under 35 U.S.C. 154(b) by 63 days.

(21) Appl. No.: 15/129,060

(22) PCT Filed: Mar. 28, 2014

(86) PCT No.: PCT/US2014/032272
§ 371 (c)(1),
(2) Date: Sep. 26, 2016

(87) PCT Pub. No.: WO2015/147883
PCT Pub. Date: Oct. 1, 2015

(65) Prior Publication Data
US 2017/0110907 A1   Apr. 20, 2017

(51) Int. Cl.
*H02J 9/06* (2006.01)
*G06F 1/30* (2006.01)
*G01R 31/40* (2014.01)

(52) U.S. Cl.
CPC ............ *H02J 9/061* (2013.01); *G01R 31/40* (2013.01); *G06F 1/30* (2013.01); *H02J 9/06* (2013.01); *Y10T 307/62* (2015.04)

(58) Field of Classification Search
CPC .................................................. Y10T 307/62
See application file for complete search history.

(56) References Cited

U.S. PATENT DOCUMENTS 4,611,289 A  *  9/1986  Coppola ................... G06F 1/30
                                                          713/300
5,612,580 A      3/1997  Janonis et al.
(Continued)

FOREIGN PATENT DOCUMENTS

CN      102200821 A     9/2011
EP        1006641 A2    6/2000
(Continued)

OTHER PUBLICATIONS

Extended European Search Report from corresponding European Application No. 14886848.2 dated Nov. 9, 2017.
(Continued)

*Primary Examiner* — Fritz M Fleming
(74) *Attorney, Agent, or Firm* — Lando & Anastasi, LLP

(57) ABSTRACT

A method for monitoring an uninterruptible power supply system described herein includes receiving, at a server, data associated with a first UPS group having a first redundancy level; receiving, at the server, data associated with a second UPS group having a second redundancy level; monitoring the uninterruptible power supply system based on the first redundancy level and the second redundancy level; and based on the monitoring, providing control signals to a first device associated with the first UPS group and a second device associated with the second UPS group.

19 Claims, 14 Drawing Sheets

(56) References Cited

U.S. PATENT DOCUMENTS

| | | |
|---|---|---|
| 6,330,176 B1 | 12/2001 | Thrap et al. |
| 7,142,950 B2 | 11/2006 | Rasmussen et al. |
| 7,514,815 B2 | 4/2009 | Paik et al. |
| 2003/0048004 A1 | 3/2003 | Fleming et al. |
| 2003/0132949 A1 | 7/2003 | Fallon et al. |
| 2004/0070279 A1* | 4/2004 | Liu .................. H02J 9/061 307/64 |
| 2005/0034003 A1 | 2/2005 | Sato et al. |
| 2007/0210652 A1 | 9/2007 | Tracy et al. |
| 2007/0216229 A1 | 9/2007 | Johnson et al. |
| 2010/0162009 A1 | 6/2010 | Togashi et al. |
| 2013/0154377 A1* | 6/2013 | Isomura ............ H02J 9/062 307/65 |

FOREIGN PATENT DOCUMENTS

| | | |
|---|---|---|
| JP | 2000163385 A | 6/2000 |
| JP | 2002136000 A | 5/2002 |
| JP | 2003036125 A | 2/2003 |
| JP | 2005078174 A | 3/2005 |
| JP | 2006172276 A | 6/2006 |
| JP | 2008140029 A | 6/2008 |
| WO | 2010038152 A1 | 4/2010 |

OTHER PUBLICATIONS

Notification of Transmittal of the International Search Report and the Written Opinion of the International Searching Authority from corresponding PCT/US2014/032272 dated Aug. 12, 2014.

* cited by examiner

SYSTEMS AND METHODS FOR MONITORING A CONFIGURATION OF UPS GROUPS WITH DIFFERENT REDUNDANCY LEVELS

CROSS-REFERENCE TO RELATED APPLICATIONS

This application is a U.S. National Stage Application under 35 U.S.C. § 371 of International Application No. PCT/US2014/032272, filed Mar. 28, 2014, titled SYSTEMS AND METHODS FOR MONITORING A CONFIGURATION OF UPS GROUPS WITH DIFFERENT REDUNDANCY LEVELS, which is hereby incorporated herein by reference in its entirety.

BACKGROUND

Technical Field

Methods and systems described herein can be used to monitor and control configurations of uninterruptible power supply (UPS) groups having different redundancy levels.

Background Discussion

In a business environment, the use of a single UPS in a power distribution system can introduce a single point of failure that can disrupt power distribution to critical devices. To reduce this risk, multiple UPS modules and batteries can be integrated together to form a UPS group to provide power distribution to critical devices with greater redundancy.

SUMMARY

One implementation described herein is a system for monitoring a first UPS group having a first redundancy level and a second UPS group having a second redundancy level, wherein the first redundancy level is different than the second redundancy level. The system includes a processing circuit configured to monitor the first UPS group and the second UPS group; and based on the monitoring and shutdown conditions, provide control signals to shut down a first device associated with the first UPS group and a second device associated with the second UPS group.

In some implementations, the processing circuit is further configured to provide control signals to the first UPS group and the second UPS group to continue to provide power independent of power status of the first device and the second device. In yet another implementation, the processing circuit is further configured to provide control signals to power off at least one of the first UPS group and the second UPS group.

In another implementation, the processing circuit is further configured to provide control signals to power off at least one of a UPS in the first UPS group and a UPS in the second UPS group.

In some implementations, the system includes a graphical user interface configured to display configuration options to a user. The configuration options include at least one of a redundancy level, a parameter related to shutdown, and a selection of a UPS for one of the first UPS group and the second UPS group.

Another implementation described herein is a method for monitoring an uninterruptible power supply system. The method includes receiving, at a server, data associated with a first UPS group having a first redundancy level, receiving, at the server, data associated with a second UPS group having a second redundancy level, wherein the second redundancy level is different than the first redundancy level, monitoring the uninterruptible power supply system based on the first redundancy level and the second redundancy level, and based on the monitoring, providing control signals to a first device associated with the first UPS group and a second device associated with the second UPS group.

In some implementations, the method includes receiving, at the server, data associated with a configuration of the first UPS group and data associated with a configuration of the second UPS group. In one implementation, the data includes at least one of a UPS group name, an IP address, and a shutdown condition for a device powered by one of the first UPS group and the second UPS group. In some implementations, the shutdown condition includes a period of time associated with shutdown. In one implementation, the period of time associated with shutdown delays a shutdown of the first device associated with the first UPS group and the second device associated with the second UPS group.

In some implementations, the shutdown condition is assigned to the first UPS group and the second UPS group. In one implementation, the shutdown condition assigned to the first UPS group is different than the shutdown condition assigned to the second UPS group.

In some implementations, the control signals controls the first UPS group and the second UPS group. In one implementation, the control signals shut down the first device associated with the first UPS group and the second device associated with the second UPS group.

Another implementation described herein includes a computer storage medium encoded with a computer program, the program comprising instructions that when executed by data processing apparatus cause the data processing apparatus to perform operations. In some implementations, the operations include receiving data associated with a first UPS group having a first redundancy level, receiving data associated with a second UPS group having a second redundancy level, monitoring the uninterruptible power supply system based on the first redundancy level and the second redundancy level, and based on the monitoring, providing control signals to a first device associated with the first UPS group and a second device associated with the second UPS group.

In some implementations, the data includes at least one of a UPS group name, an IP address, and a shutdown condition. In one implementation, the shutdown condition comprises a configuration of a number of UPS's required to power a load. In another implementation, the shutdown condition comprises a period of time associated with shutdown. In some implementations, the period of time associated with shutdown delays a shutdown of the first device associated with the first UPS group and the second device associated with the second UPS group.

Still other aspects, implementations, and advantages of these exemplary aspects and implementations, are discussed in detail below. Moreover, it is to be understood that both the foregoing information and the following detailed description are merely illustrative examples of various aspects and implementations, and are intended to provide an overview or framework for understanding the nature and character of the claimed subject matter. Particular references to examples and implementations, such as "an implementation," "another implementation," "some implementations," "other implementations," "an alternate implementation," "various implementations," "one implementation," "at least one implementations," "this and other implementations" or the like, are not necessarily mutually exclusive and are intended to indicate that a particular feature, structure, or characteristic described in connection with the implementation or example and may be included in that implementation or example and other implementations or examples. The appearances of such terms herein are not necessarily all referring to the same implementations or example.

Furthermore, in the event of inconsistent usages of terms between this document and documents incorporated herein by reference, the term usage in the incorporated references is supplementary to that of this document; for irreconcilable inconsistencies, the term usage in this document controls. In addition, the accompanying drawings are included to provide illustration and a further understanding of the various aspects and embodiments, and are incorporated in and constitute a part of this specification. The drawings, together with the remainder of the specification, serve to explain principles and operations of the described and claimed aspects and implementations.

BRIEF DESCRIPTION OF THE DRAWINGS

Various aspects of at least one implementation are discussed below with reference to the accompanying figures, which are not intended to be drawn to scale. The figures are included to provide an illustration and a further understanding of the various aspects and implementations, and are incorporated in and constitute a part of this specification, but are not intended as a definition of the limits of any particular implementation. The drawings, together with the remainder of the specification, serve to explain principles and operations of the described and claimed aspects and implementations. In the figures, each identical or nearly identical component that is illustrated in various figures is represented by a like numeral. For purposes of clarity, not every component may be labeled in every figure. In the figures:

DETAILED DESCRIPTION

Figure 1A:
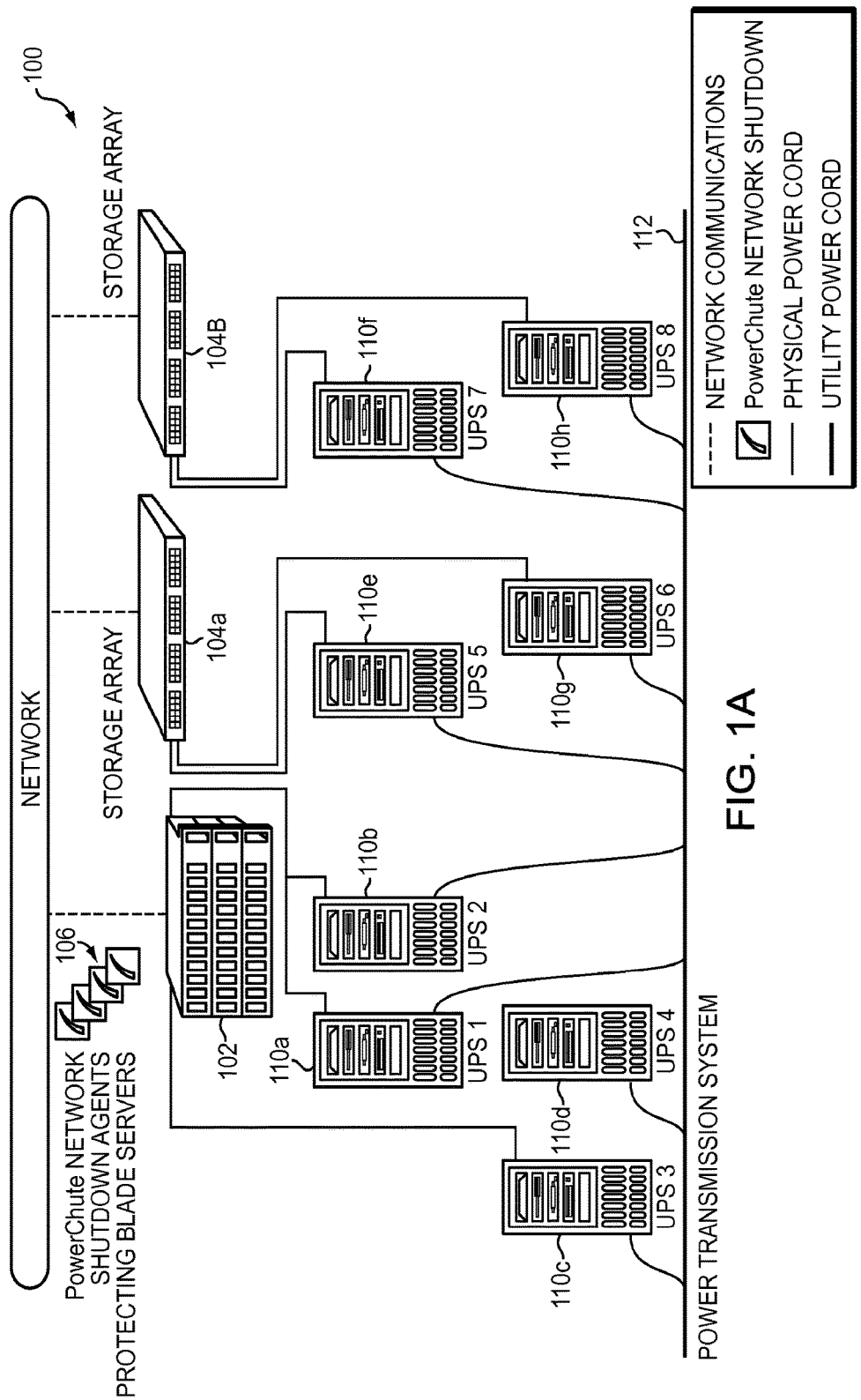
FIG. 1A is a block diagram of a redundant UPS configuration, according to one implementation.

Examples of the methods and systems discussed herein are not limited in application to the details of construction and the arrangement of components set forth in the following description or illustrated in the accompanying drawings. The methods and systems are capable of implementation in other embodiments and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated references is supplementary to that of this document; for irreconcilable inconsistencies, the term usage in this document controls.

Power distribution systems in facilities, such as data centers, that contain critical loads often include redundant power sources so that in the event of one power source failing, one or more alternative power sources are able to power the loads. The redundancy may also be enhanced by connecting each power supply to its own UPS. In this implementation, there is protection for the critical loads from both a power supply failure and a UPS failure.

With redundant UPS groups, and redundant power sources, the task of controlling and monitoring UPS's and appropriately providing shutdown control signals to devices, such as servers, powered by the UPS systems can become quite complex. Further, it can be difficult to determine a power redundancy level available for devices and ensure that a desired redundancy level is met.

In at least some embodiments, systems and methods are provided for simplifying the monitoring and control of UPS systems and devices having different desired redundancy levels. The systems and methods can be configured to provide control signals to devices to provide graceful shutdown to devices, when only battery power is being provided with a limited battery capacity or when a desired redundancy level has been lost. Further, the systems and methods may also provide control signals to UPS systems to shut down completely or to shut off the power from specific power outlets to control the power being provided to devices.

The control signals are provided based on an identified shutdown condition by the system based on configuration data entered by a user including a desired redundancy level, which may be different for each device. The shutdown condition may result in a command being provided to each device that will be shut down. In one embodiment, the system includes a module installed on each device, such as a server, that will be shut down. Each module communicates with each UPS via a Network Management Card in each UPS. In other embodiments, a separate control server will be used as a control module.

A single module can monitor different redundancy levels for devices powered by each UPS group and provide shutdown signals to the devices. Peripheral devices, such as blade servers, storage arrays, etc. may also be monitored by the single module and receive shutdown signals. The redundancy levels may be modified by the user based on the characteristics of the peripheral devices. In addition, shutdown times provided in shutdown signals may vary based on the function of a server and/or peripheral devices. The user has flexibility within a configuration to set different redundancy levels per UPS group.

As shown in FIG. 1A, a system 100 including a redundant UPS configuration is shown, according to one implementation. The system 100 includes a server 102, a plurality of storage arrays 104a, 104b, a plurality of network shutdown agents 106, and a plurality of UPS's 110a-h, and a power transmission system 112 that the plurality of UPS's are connected.

The plurality of network shutdown agents 106 monitor the plurality of UPS's 110a-h, even if the plurality of UPS's 110a-h have different redundancy levels. The redundancy level may be set on a per group of UPS basis, e.g., N+1, N+2, etc. Each server 102 or the plurality of storage arrays 104a, 104b may be protected by the plurality of UPS's 110a-d or 110e-h, respectively. A network management card installed in each UPS, described further below with reference to FIGS. 2A-2L, may communicate with each server 140 that has one of the plurality of network shutdown agents 106 installed. Servers and other computer systems may be embodied in different types of computer systems as will now be described with reference to FIG. 1B.

Figure 1B:
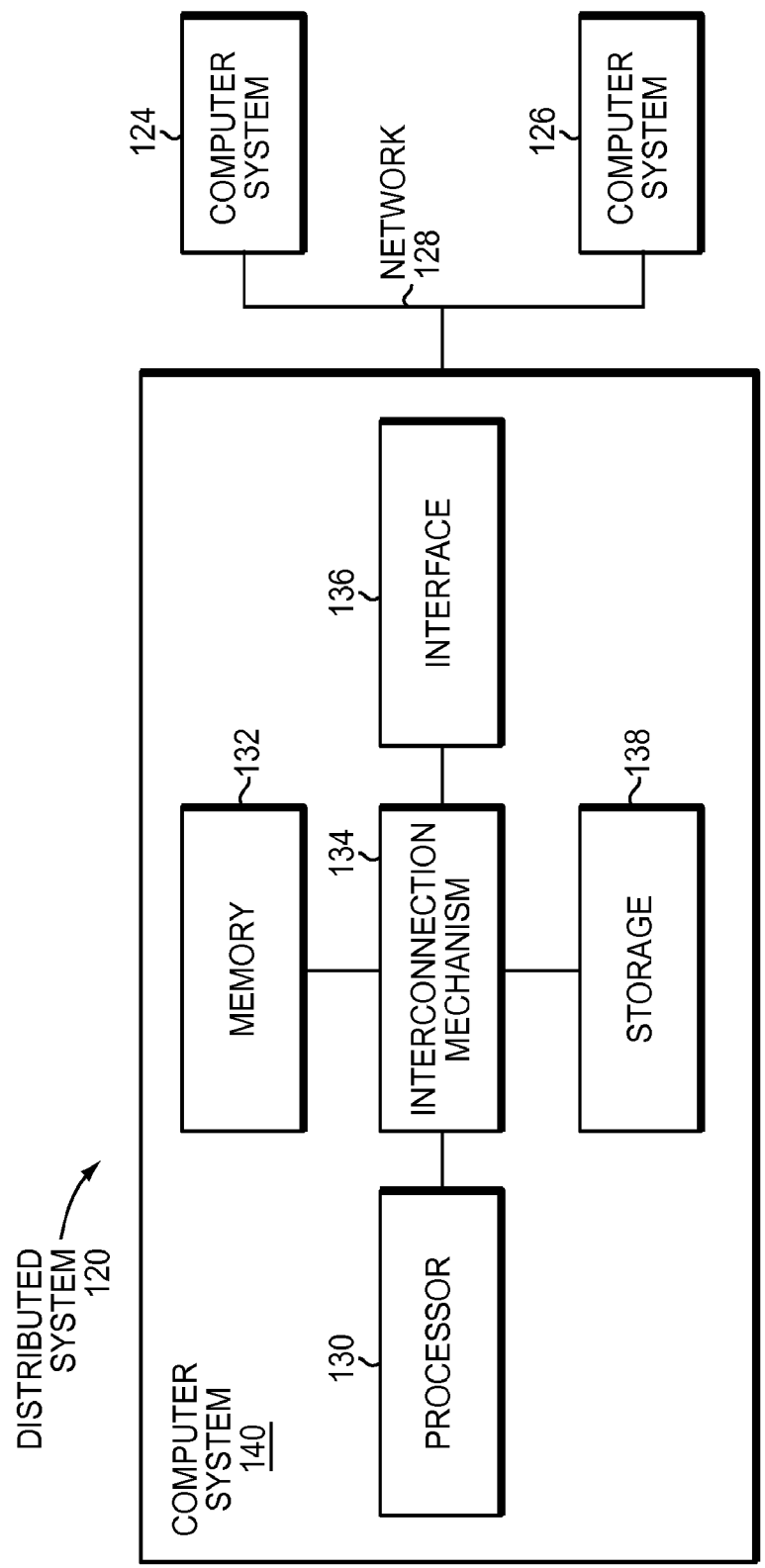
FIG. 1B is a block diagram of a computer system, according to one implementation.

Referring to FIG. 1B, there is illustrated a block diagram of a distributed computer system 120, in which various aspects and functions are practiced. As shown, the distributed computer system 120 includes one or more computer systems that exchange information. More specifically, the distributed computer system 120 includes computer systems 140, 124, and 126. As shown, the computer systems 140, 124, and 126 are interconnected by, and may exchange data through, a communication network 128. The network 128 may include any communication network through which computer systems may exchange data. To exchange data using the network 128, the computer systems 140, 124, and 126 and the network 128 may use various methods, protocols and standards, including, among others, Fiber Channel, Token Ring, Ethernet, Wireless Ethernet, Bluetooth, IP, IPV6, TCP/IP, UDP, DTN, HTTP, FTP, SNMP, SMS, MMS, SS7, JSON, SOAP, CORBA, REST, and Web Services. To ensure data transfer is secure, the computer systems 140, 124, and 126 may transmit data via the network 128 using a variety of security measures including, for example, SSL or VPN technologies. While the distributed computer system 120 illustrates three networked computer systems, the distributed computer system 120 is not so limited and may include any number of computer systems and computing devices, networked using any medium and communication protocol.

As illustrated in FIG. 1B, the computer system 140 includes a processor 130, a memory 132, an interconnection element 134, an interface 136 and data storage element 138. To implement at least some of the aspects, functions, and processes disclosed herein, the processor 130 performs a series of instructions that result in manipulated data. The processor 130 may be any type of processor, multiprocessor or controller. Example processors may include a commercially available processor such as an Intel Xeon, Itanium, Core, Celeron, or Pentium processor; an AMD Opteron processor; an Apple A4 or A5 processor; a Sun UltraSPARC processor; an IBM Power5+ processor; an IBM mainframe chip; or a quantum computer. The processor 130 is connected to other system components, including one or more memory devices 132, by the interconnection element 134.

The memory 132 stores programs (e.g., sequences of instructions coded to be executable by the processor 130) and data during operation of the computer system 140. Thus, the memory 132 may be a relatively high performance, volatile, random access memory such as a dynamic random access memory ("DRAM") or static memory ("SRAM").

However, the memory 132 may include any device for storing data, such as a disk drive or other nonvolatile storage device. Various examples may organize the memory 132 into particularized and, in some cases, unique structures to perform the functions disclosed herein. These data structures may be sized and organized to store values for particular data and types of data.

Components of the computer system 140 are coupled by an interconnection element such as the interconnection element 134. The interconnection element 134 may include any communication coupling between system components such as one or more physical busses in conformance with specialized or standard computing bus technologies such as IDE, SCSI, PCI and InfiniBand. The interconnection element 134 enables communications, including instructions and data, to be exchanged between system components of the computer system 140.

The computer system 140 also includes one or more interface devices 136 such as input devices, output devices and combination input/output devices. Interface devices may receive input or provide output. More particularly, output devices may render information for external presentation. Input devices may accept information from external sources. Examples of interface devices include keyboards, mouse devices, trackballs, microphones, touch screens, printing devices, display screens, speakers, network interface cards, etc. Interface devices allow the computer system 140 to exchange information and to communicate with external entities, such as users and other systems.

The data storage element 138 includes a computer readable and writeable nonvolatile, or non-transitory, data storage medium in which instructions are stored that define a program or other object that is executed by the processor 130. The data storage element 138 also may include information that is recorded, on or in, the medium, and that is processed by the processor 130 during execution of the program. More specifically, the information may be stored in one or more data structures specifically configured to conserve storage space or increase data exchange performance. The instructions may be persistently stored as encoded signals, and the instructions may cause the processor 130 to perform any of the functions described herein. The medium may, for example, be optical disk, magnetic disk or flash memory, among others. In operation, the processor 130 or some other controller causes data to be read from the nonvolatile recording medium into another memory, such as the memory 132, that allows for faster access to the information by the processor 130 than does the storage medium included in the data storage element 138. The memory may be located in the data storage element 138 or in the memory 132, however, the processor 130 manipulates the data within the memory, and then copies the data to the storage medium associated with the data storage element 138 after processing is completed. A variety of components may manage data movement between the storage medium and other memory elements and examples are not limited to particular data management components. Further, examples are not limited to a particular memory system or data storage system.

Although the computer system 140 is shown by way of example as one type of computer system upon which various aspects and functions may be practiced, aspects and functions are not limited to being implemented on the computer system 140 as shown in FIG. 1B. Various aspects and functions may be practiced on one or more computers having a different architectures or components than that shown in FIG. 1B. For instance, the computer system 140 may include specially programmed, special-purpose hardware, such as an application-specific integrated circuit ("ASIC") tailored to perform a particular operation disclosed herein. While another example may perform the same function using a grid of several general-purpose computing devices running MAC OS System X with Motorola PowerPC processors and several specialized computing devices running proprietary hardware and operating systems.

The computer system 140 may be a computer system including an operating system that manages at least a portion of the hardware elements included in the computer system 140. In some examples, a processor or controller, such as the processor 130, executes an operating system. Examples of a particular operating system that may be executed include a Windows-based operating system, such as, Windows Server 2008 and 2012, Windows XP, Windows Vista or Windows 7 operating systems, available from the Microsoft Corporation, a MAC OS System X operating system or an iOS operating system available from Apple Computer, one of many Linux-based operating system distributions, for example, the Enterprise Linux operating system available from Red Hat Inc., a Solaris operating system available from Oracle Corporation, or a UNIX operating systems available from various sources. Many other operating systems may be used, and examples are not limited to any particular operating system.

The processor 130 and operating system together define a computer platform for which application programs in high-level programming languages are written. These component applications may be executable, intermediate, bytecode or interpreted code which communicates over a communication network, for example, the Internet, using a communication protocol, for example, TCP/IP. Similarly, aspects may be implemented using an object-oriented programming language, such as .Net, SmallTalk, Java, C++, Ada, C# (C-Sharp), Python, or JavaScript. Other object-oriented programming languages may also be used. Alternatively, functional, scripting, or logical programming languages may be used.

Additionally, various aspects and functions may be implemented in a non-programmed environment. For example, documents created in HTML, XML or other formats, when viewed in a window of a browser program, can render aspects of a graphical-user interface or perform other functions. Further, various examples may be implemented as programmed or non-programmed elements, or any combination thereof. For example, a web page may be implemented using HTML while a data object called from within the web page may be written in C++. Thus, the examples are not limited to a specific programming language and any suitable programming language could be used. Accordingly, the functional components disclosed herein may include a wide variety of elements (e.g., specialized hardware, executable code, data structures or objects) that are configured to perform the functions described herein.

In some examples, the components disclosed herein may read parameters that affect the functions performed by the components. These parameters may be physically stored in any form of suitable memory including volatile memory (such as RAM) or nonvolatile memory (such as a magnetic hard drive). In addition, the parameters may be logically stored in a propriety data structure (such as a database or file defined by a user mode application) or in a commonly shared data structure (such as an application registry that is defined by an operating system). In addition, some examples provide for both system and user interfaces that allow external entities to modify the parameters and thereby configure the behavior of the components.

Graphical User Interface for Setup of UPS Groups

In at least one embodiment, a user is provided with a graphical user interface through a user interface of a computer system, such as one described above, to simply configure and monitor redundant UPS configurations. The graphical user interface will now be described with reference to FIGS. 2A-2L, which show different screen of the graphical user interface.

Figure 2A:
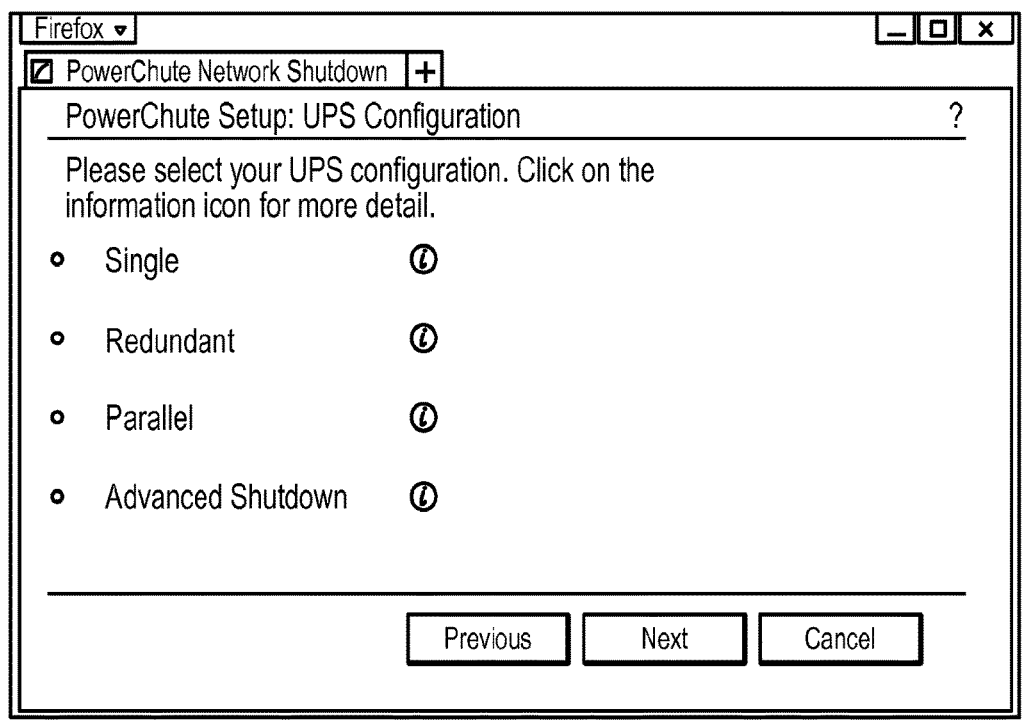
FIG. 2A is an illustration of a graphical user interface configured for a user to select a UPS configuration, according to one implementation.

FIG. 2A is an illustration of a screen 200 of the graphical user interface configured for a user to select a UPS configuration and set redundancy levels and shutdown conditions, according to one implementation. A graphical user interface 200 is displayed to a user. The screen 200 allows the user to select one of a single, a redundant, a parallel or an advanced shutdown configuration the user may retrieve additional information related to each selection. In screen 200, the advanced shutdown configuration has been selected.

Figure 2B:
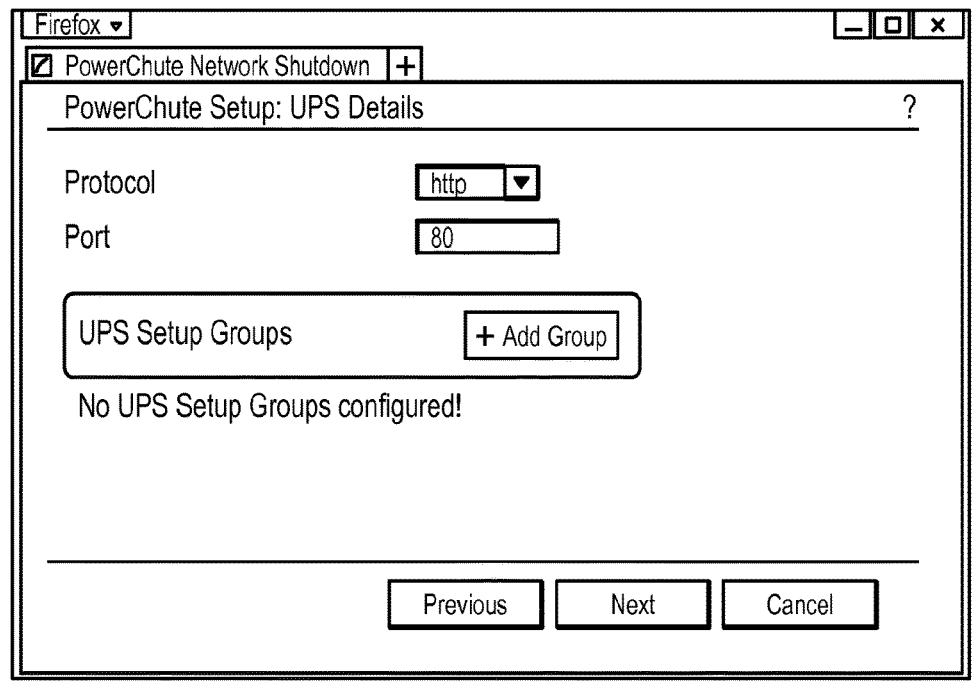
FIG. 2B is an illustration of a graphical user interface for configuring a UPS group, according to one implementation.

Based on the selection of "advanced shutdown" in FIG. 2A, the user may select "previous" to go to a previous screen, "cancel" to opt out of the UPS configuration selection or the user may select "next" to go a subsequent screen, which is depicted in FIG. 2B.

Referring to FIG. 2B, a screen 202 for configuring a UPS group is shown. Using screen 202, the user has the option to add, remove or edit one or more UPS groups, and identify a port associated with a network management card that is in the UPS system and the protocol associated with the port.

The ports may be modified by the user or the standard port associated with the protocol may be used. In the state shown for screen 202 in FIG. 2B, no UPS groups have been configured in the system. The user can configure a group by selecting the "Add Group" button at which point a pop-up screen 204 will displayed on screen 202 as shown in FIG. 2C.

Figure 2C:
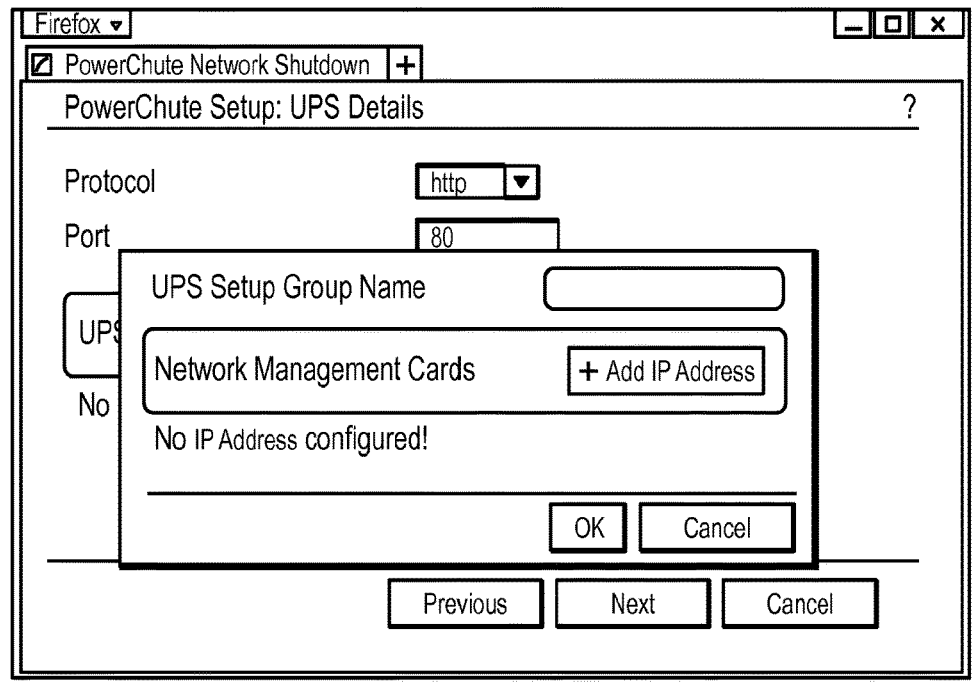
FIG. 2C is an illustration of a graphical user interface for providing a name of the UPS group, according to one implementation.
Figure 2D:
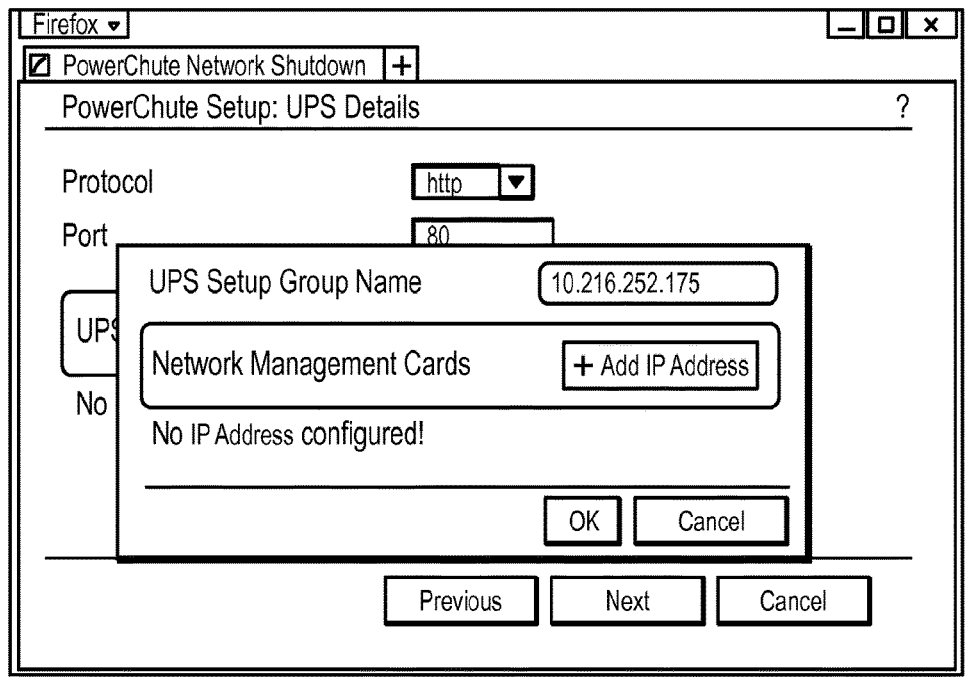
FIG. 2D is an illustration of a graphical user interface configured for the user to provide an IP address of a network management card of a UPS in the UPS group, according to one implementation.

Referring to FIG. 2C, in the pop-up screen 204, the name of a UPS group may be provided by the user. Once the group has been named, IP addresses for the network management cards for devices in the group can be added as shown in FIGS. 2D and 2E by selecting the "Add IP Address" button in pop-up screen 204.

Figure 2E:
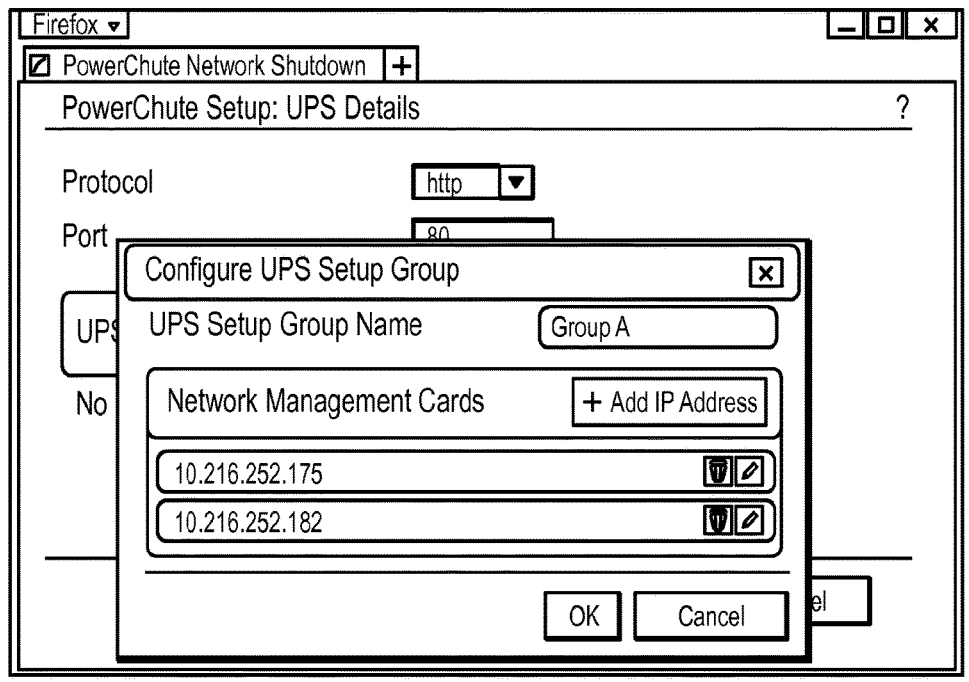
FIG. 2E is an illustration of a graphical user interface configured to display the IP address of a network management card of a UPS in the UPS group, according to one implementation.

As illustrated in FIG. 2E, clickable icons are displayed next to each IP address, which allows the user to delete or edit the IP address. If the user selects the OK button, then the settings are stored in a memory. If the user selects the cancel button, then any changes made to the UPS group will be canceled. After the user selects the "OK" button on the screen of FIG. 2E, the system returns to the screen 202, which is now modified to show that two groups have been added as shown in FIG. 2F.

Figure 2F:
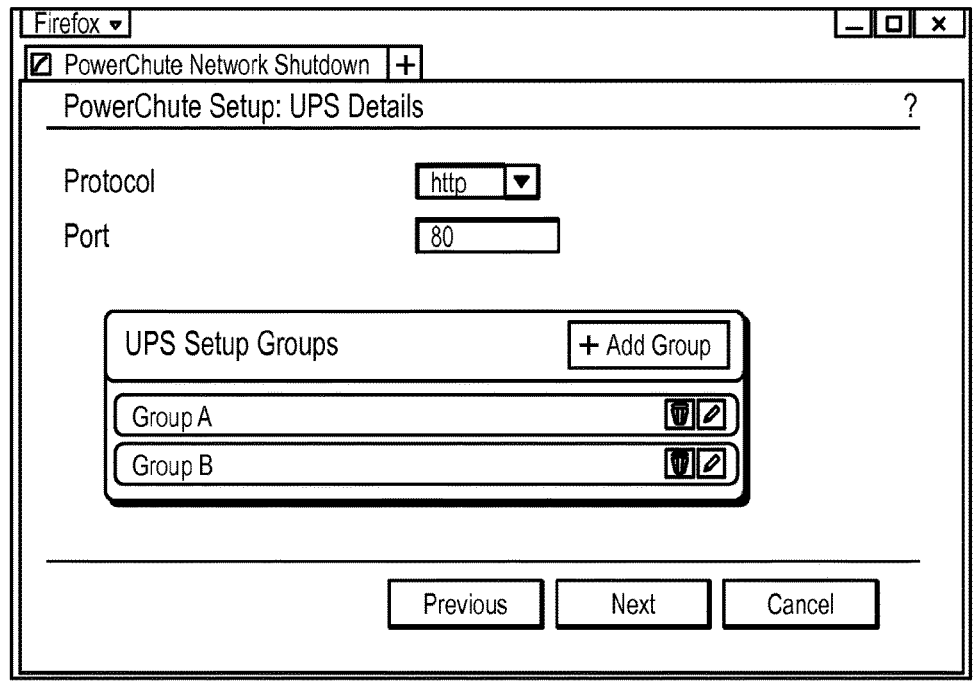
FIG. 2F is an illustration of a graphical user interface configured to display the UPS groups, according to one implementation.

Once at least one group is added, a user can select the "next" button, which displays the interface illustrated in FIG. 2F. Referring to FIG. 2F, an illustration of the graphical user interface configured to display the UPS groups is shown, according to one implementation. UPS groups that have been added are displayed on a UPS details page along with icons to edit or delete the UPS group. For example, if the user selects the trash can icon, then a pop-up window is displayed to confirm the deletion of a UPS group. After the user selects the "next" button on the screen of FIG. 2F, the system returns to the screen 202, which is now modified to show the details of one of the two UPS groups have been added as shown in FIG. 2G.

Figure 2G:
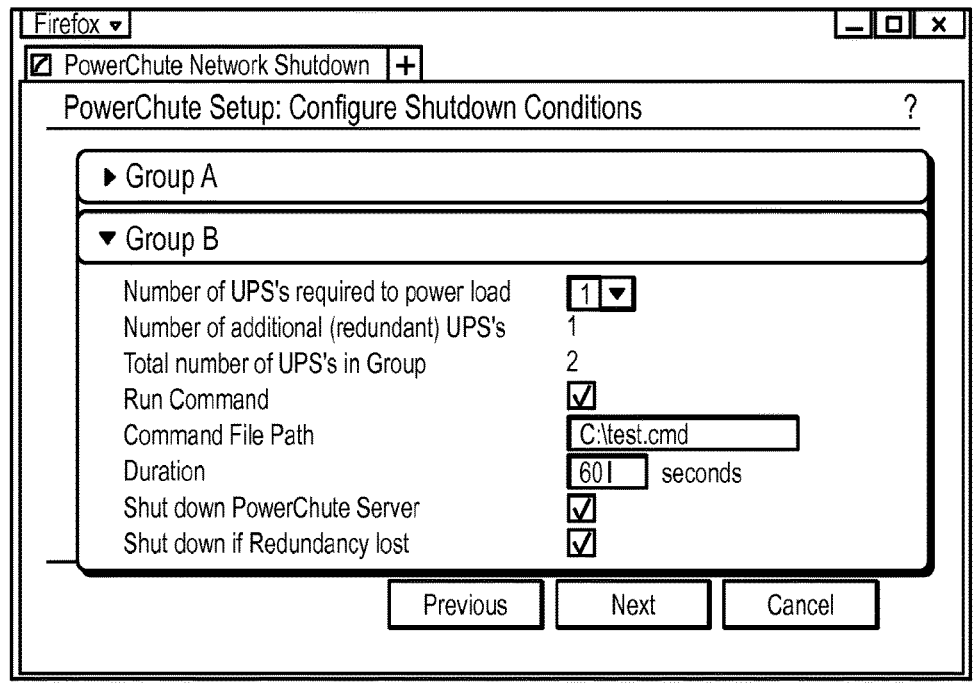
FIG. 2G is an illustration of a graphical user interface configured for the user to select a shutdown condition for the UPS group, according to one implementation.

Referring to FIG. 2G, an illustration of a screen 206 of the graphical user interface configured for the user to select a shutdown condition for the UPS groups is shown, according to one implementation. The interface displayed allows the user to configure the number of UPS's required to power a given load. The interface includes other options to run a command file, shut down a server, shut down if redundancy is lost, etc.

Figure 2H:
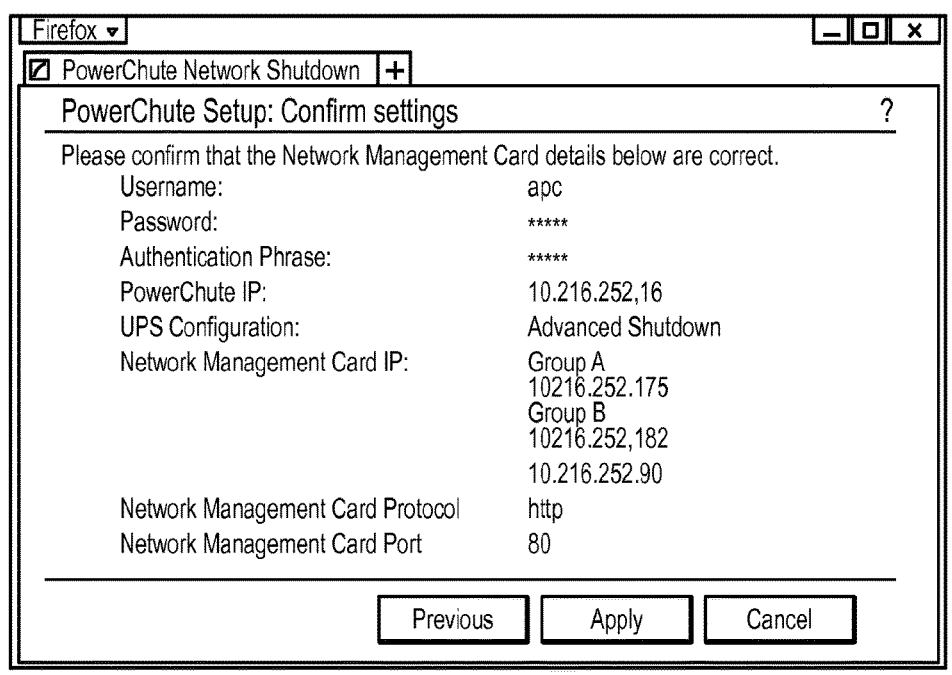
FIG. 2H is an illustration of a graphical user interface configured for the user to confirm settings for the UPS group, according to one implementation.

Referring to FIG. 2H, an illustration of the graphical user interface configured for the user to confirm settings for the UPS group is shown, according to one implementation. As shown in FIG. 2H, the graphical user interface displays the NMC IP information for each UPS group. The user can select apply to confirm the settings.

Figure 2I:
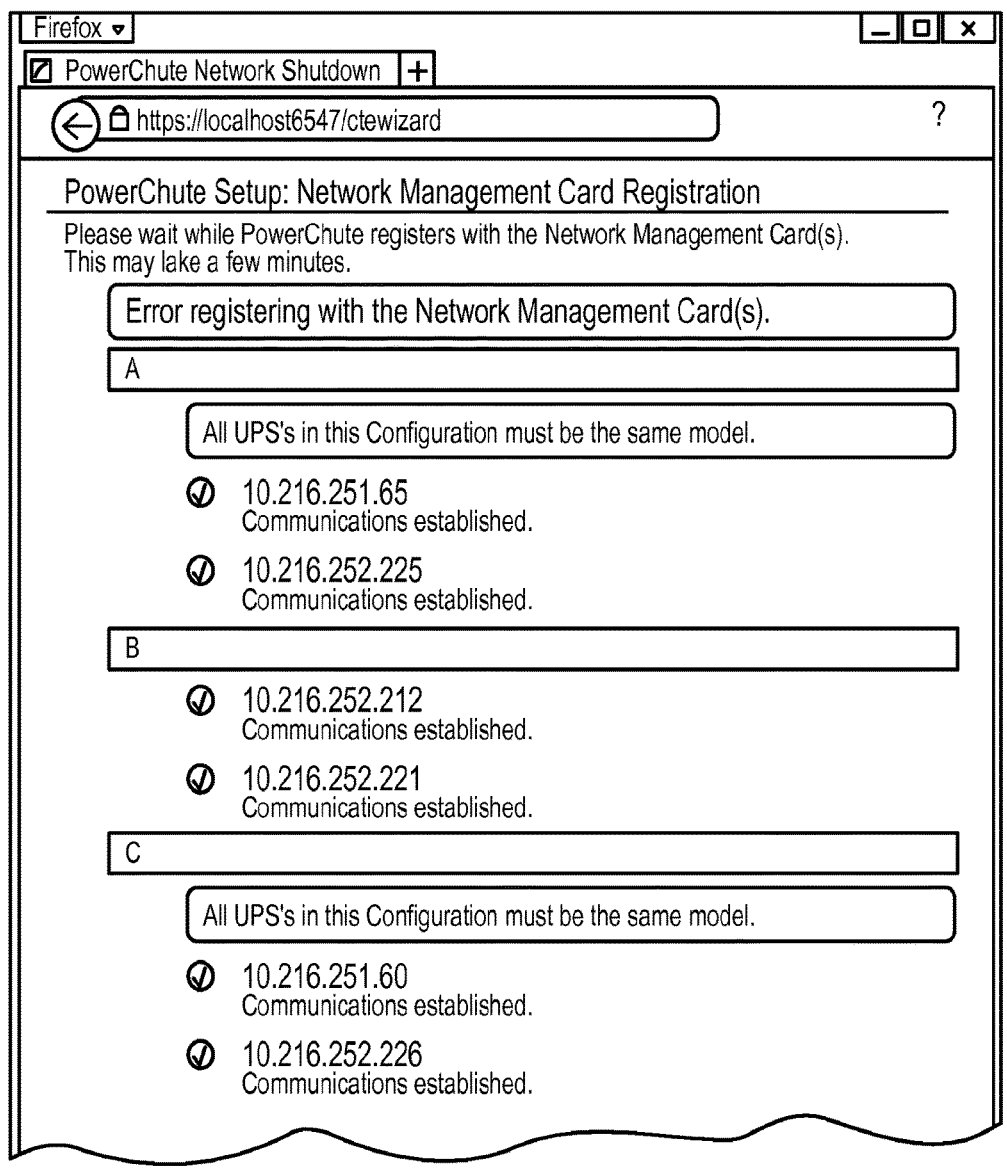
FIG. 2I is an illustration of a graphical user interface configured to display the network management card IP information for the UPS group, according to one implementation.

Referring to FIG. 2I, an illustration of the graphical user interface configured to display the network management card IP information for the UPS group is shown, according to one implementation. As shown in FIG. 2I, the graphical user interface displays the registration status for each NMC IP address per UPS group. In this implementation, all of the NMC's are displayed under a header displaying the group name.

Figure 2J:
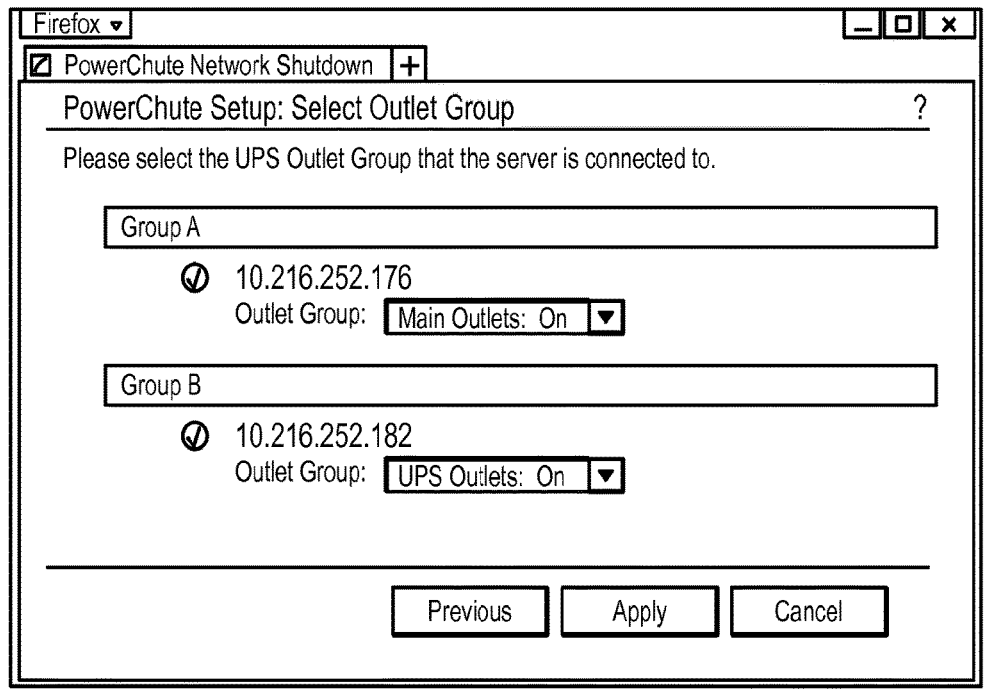
FIG. 2J is an illustration of the graphical user interface configured for the user to select the UPS Outlet group that the server/equipment is connected to, according to one implementation.

Referring to FIG. 2J, an illustration of the graphical user interface configured for the user to select the UPS Outlet group that the server/equipment is connected to, according to one implementation. As illustrated in FIG. 2J, the graphical user interface displays the NMC IP address for each UPS group. In this implementation, the NMC's with their UPS Outlet groups are displayed under a header displaying the group name.

Figure 2K:
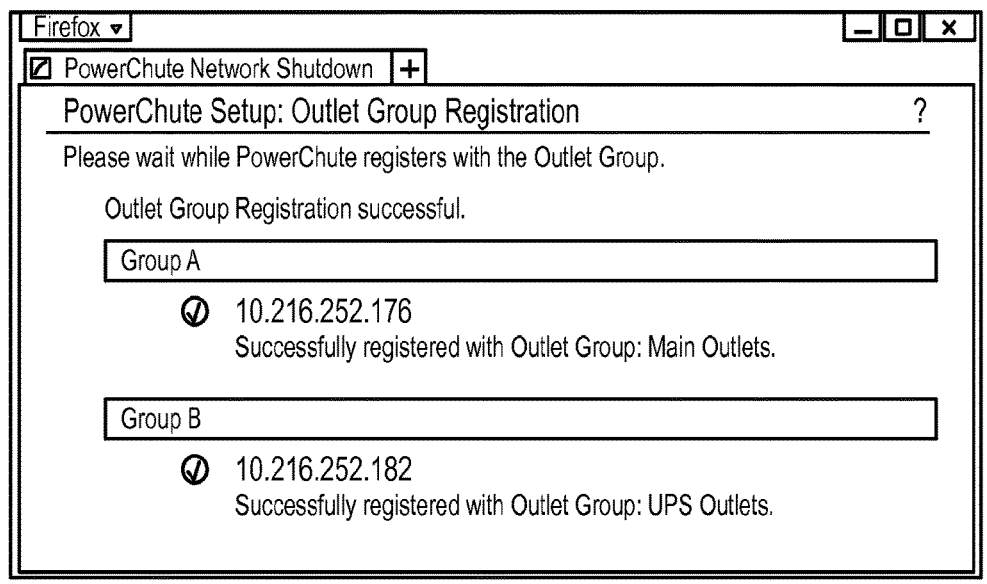
FIG. 2K is an illustration of the graphical user interface configured to display the UPS outlet groups on each NMC that the UPS group is registered with is shown, according to one implementation.

Referring to FIG. 2K, an illustration of the graphical user interface configured to display the UPS outlet groups on each NMC that the UPS group is registered with is shown, according to one implementation. As illustrated by FIG. 2K, the graphical user interface displays the NMC addresses per group. In this implementation, the NMC's with their UPS groups are displayed under a header displaying the group name.

Figure 2L:
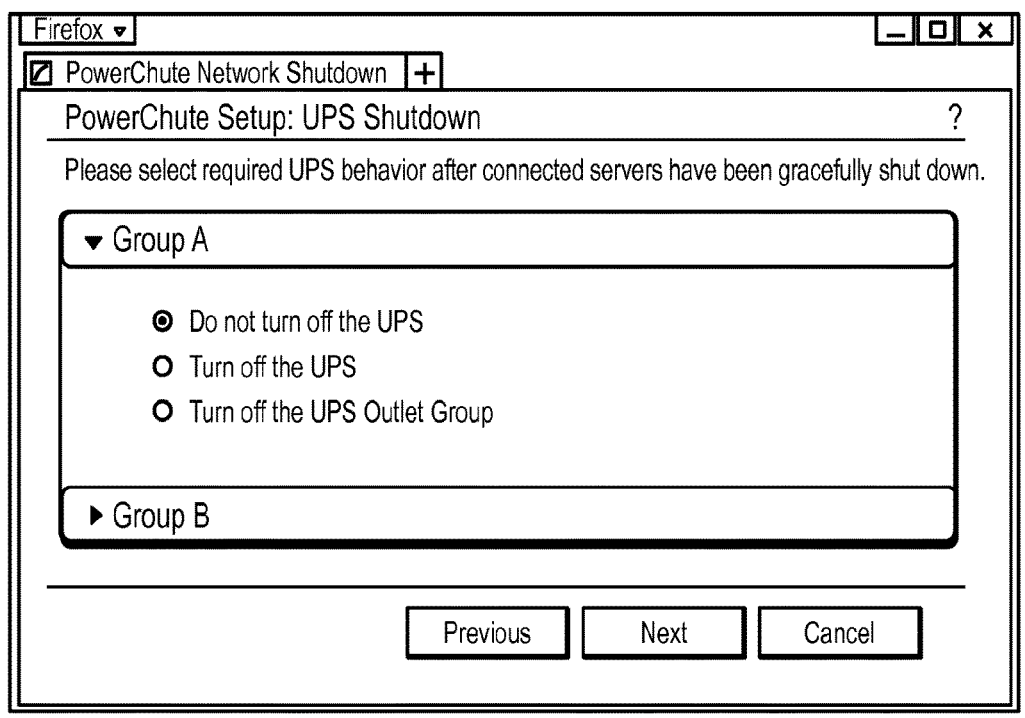
FIG. 2L is an illustration of a graphical user interface configured for the user to select a shutdown option for each UPS group after each connected server is shut down, according to one implementation.

Referring to FIG. 2L, an illustration of the graphical user interface configured for the user to select a UPS shutdown option for each UPS group after each connected server is shut down, according to one implementation. As illustrated by FIG. 2L, the graphical user interface allows the user to configure different UPS shutdown options for each UPS group. The user can select the UPS behavior after a connected device (server) has been shut down. In this implementation, the user can select to not turn off the UPS, turn off the UPS, or turn off the UPS Outlet group.

Once the graphical user interface setup has been completed, the user can then configure shutdown actions for UPS events. The management and aggregation of the UPS events is described in FIG. 3.

Figure 3:
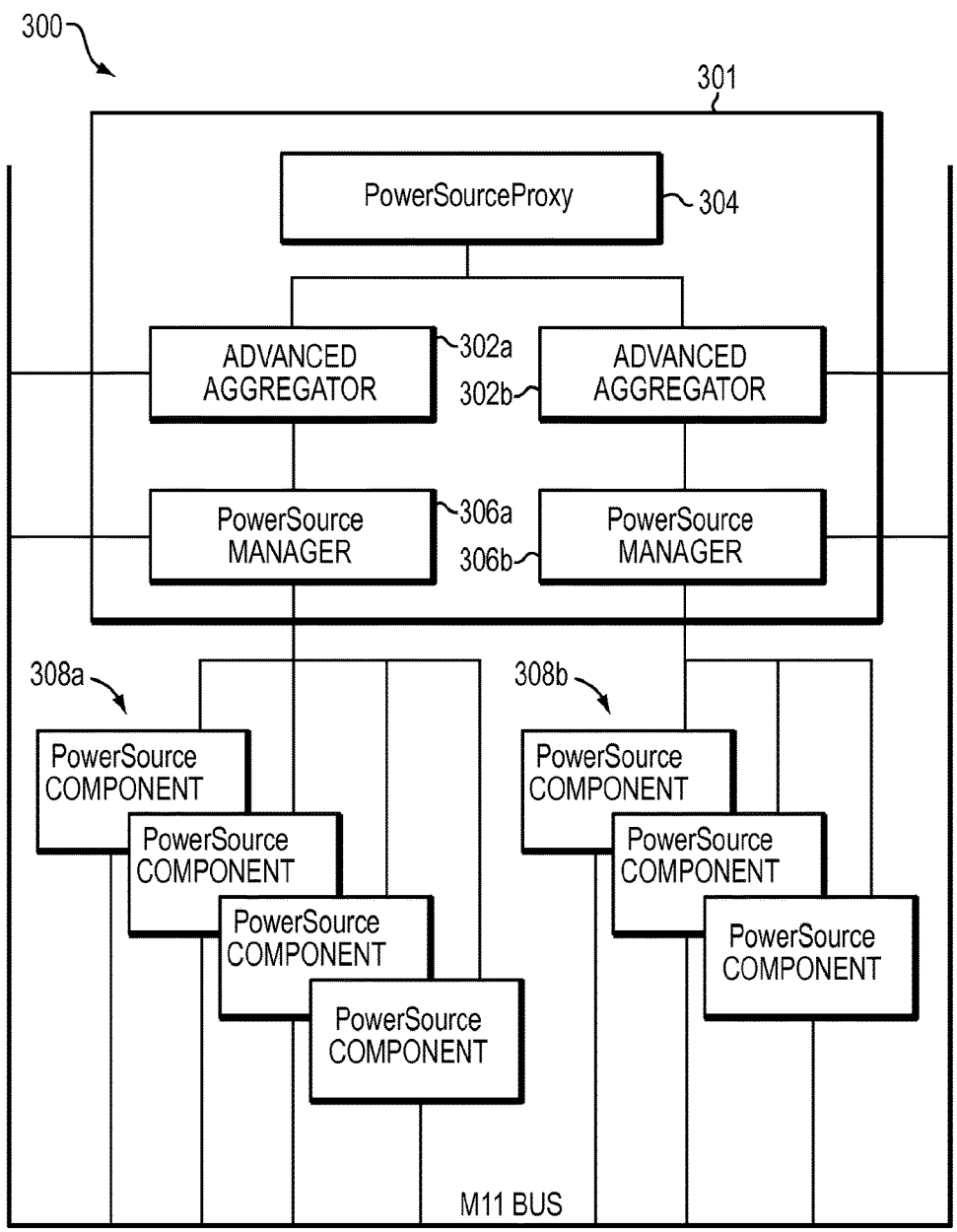
FIG. 3 is a block diagram of a system for managing and aggregating events for a UPS group, according to one implementation.

FIG. 3 is a block diagram 300 of a system 301 for managing and aggregating events for a UPS group, according to one implementation. In a general overview, the system 301 may be implemented as a server which includes functional modules including aggregators 302*a*, 302*b*, a PowerSource Proxy 304, and PowerSource Manager 306*a*, 306*b*. The server 301 provides and receives information from two groups of PowerSource Components 308*a*, 308*b*. The power source components may be individual UPS's or a plurality of UPS's.

The system 301 aggregates UPS events for advanced redundant UPS configurations, i.e., UPS's with different redundancy levels, and compares the events with stored parameters to determine if shutdown signals should be communicated to one or more devices and one or more UPS's. Not all events will lead to the communication of shutdown signals. For example, in a group with four UPS's, in which two are required to power the load and two are spare, if a power outage occurs on two UPS's, then an event is not triggered, because the number of UPS's at which the power outage occurs is not greater than the total number of spare UPS's. However, in this example, if a power outage occurs on three UPS's, then a shutdown condition may be triggered, and shutdown signals may be communicated because the three UPS's affected are greater than the total number of spare UPS's, which in this example is two.

If devices powered by a UPS group are configured to shut down on lost redundancy, then the system 301 effectively subtracts one from the total number of spare UPS's in a UPS group. Using the example above, a shutdown condition is triggered if it occurs on two UPS's if shutdown on lost redundancy is enabled for the UPS group. Thus, if the power outage occurs on two UPS's, then the shutdown condition is triggered, because the number of UPS's affected is greater than the total number of spares (two) minus one.

In another implementation, other UPS configurations may be used, such as, but not limited to, single (N+0), redundant (N+1, N+2, etc.), parallel, etc. In single, redundant, and parallel UPS configurations, one aggregator is used to manage and aggregate the events for the UPS groups. The aggregator may include a module that tracks events reported by the UPS's.

In some implementations, the aggregators 302*a*, 302*b* for each UPS group may be configured during setup. As illustrated by FIG. 3, each aggregator 302*a*, 302*b* for each UPS group may also include the PowerSource proxy 304 that handles data from each aggregator 302*a*, 302*b*.

Each aggregator 302a, 302b may be used as a source of data in the overall UPS system. For example, the aggregators 302a, 302b may provide a list of UPS model names for the UPS's associated with the aggregators 302a, 302b. In another implementation, the aggregators 302a, 302b may provide a list of the IP address of the NMC's in the UPS's associated with the aggregator 302a, 302b.

The aggregation of data for an advanced configuration is performed by multiple aggregators 302a, 302b, according to one implementation. The PowerSource Proxy 304 is an entry point for all of the information, e.g., event data from the different network management cards associated with the UPS's in each group. The event data is passed to each aggregator 302a, 302b. Each aggregator 302a, 302b reviews redundancy rules and determines whether a critical event has occurred, i.e., an event that will affect one or more powered devices, depending on the redundancy level for each UPS group. Each aggregator 302a, 302b determines whether to take an action based on this information. For example, aggregator 302a may receive information that there is a critical event occurring at UPS #1, but the redundancy level is N+2, and thus, no action will be taken.

PowerSource Manager 306a, 306b receives the determination on whether to take an action and controls and monitors the different power sources for all of the PowerSource Components 308a, 308b, i.e., the UPS's. The PowerSource components 308a, 308b also provide information to the PowerSource Manager 306a, 306b.

Figure 4:
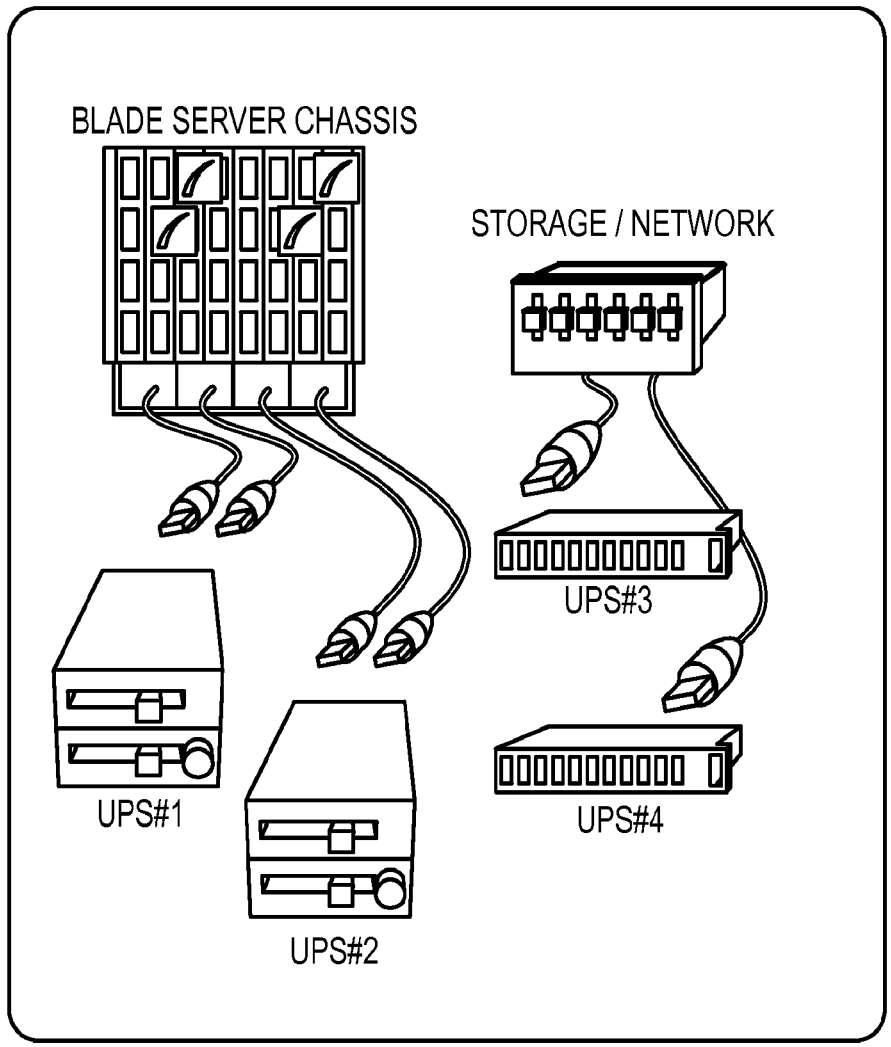
FIG. 4 is a block diagram of a system without a control server, according to one implementation.
Figure 5:
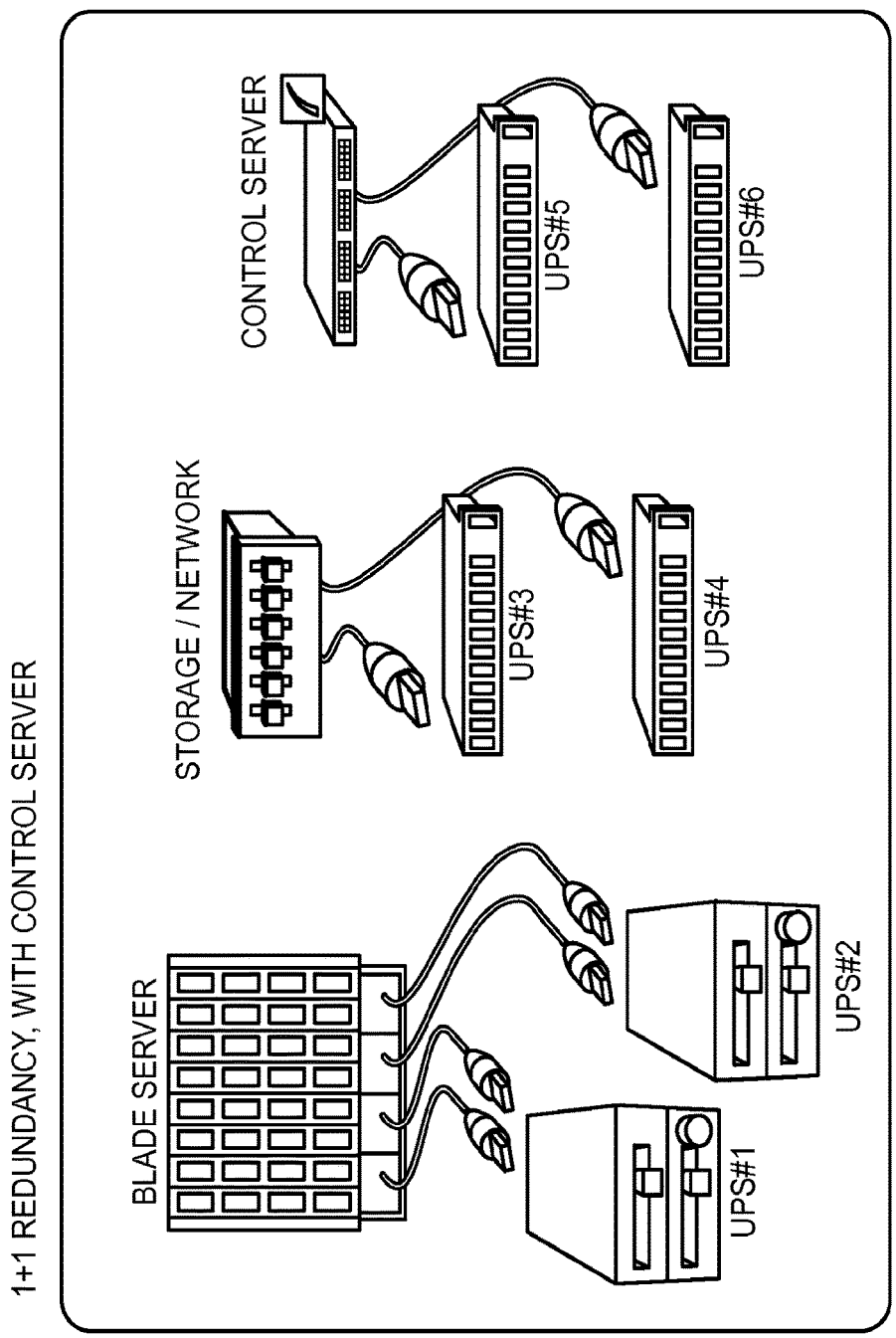
FIG. 5 is a block diagram of a system with a control server, according to a second implementation.

The system 301 may be used in a number of configurations of UPS groups. For example, the system 301 may be installed on a blade server, i.e., without a separate control server, as shown in FIG. 4. In another example, the system 300 may be installed on a control server powered by one of the UPS groups, as shown in FIG. 5.

System Configurations

FIG. 4 is a block diagram of a system without a control server, according to one implementation. In the system shown in FIG. 4, the functions of the system 301 described above may be implemented by modules operating on one or more blade servers.

The process for configuring the UPS groups of FIG. 4 is performed by a user interfacing with one of the blade servers using the process described above with reference to FIGS. 2A-2L. The blade server may include a single module that registers and monitors the UPS groups. The redundancy settings may also be configured. In FIG. 4, a N+1 redundancy is set for each UPS group. An option to shut down each group is enabled. In some implementations, a command file may be used to safely shutdown the storage array depending on the type of storage array. In other implementations, the command file may not be needed, because the storage array is shut down when the UPS is shut down. In this implementation, the single module is running locally on the blade server so a shutdown command can be sent directly by the single module to the blade server. In FIG. 5, however, the single module sends the shutdown command remotely from the control server to each blade server, i.e., the command file is used to achieve remote shutdown.

An additional option to shutdown may be provided based on lost redundancy. The shutdown behavior of the system in FIG. 4 may include operating UPS #1-#4 on battery, while the blade servers are safely shut down. The UPS groups may delay their own functionality in order to slow down or delay the process of shutdown of the storage array/network or other peripheral devices. For example, the UPS groups can be configured with a Power Off delay that is counted down once the UPS is commanded to shut down. This Power Off delay can be set to a large enough value such that the storage array is powered off after other equipment that may be dependent on it has already been shut down.

FIG. 5 is a block diagram of a system with a control server, according to one implementation. In the system shown in FIG. 5, the functions of the system 301 described above may be implemented by modules operating on a control server.

The process for configuring the groups of FIG. 5 is performed by a user interfacing with the control server using the process described above with reference to FIGS. 2A-2L. The control server may include a single module that registers and monitors the UPS groups A, B and C. The redundancy settings may also be configured. In FIG. 5, a N+1 redundancy is set for each UPS group. An option to shutdown each group is enabled. In this implementation, a command file is used to remotely shut down the blade server and the storage/network. An additional option to shut down may be provided based on lost redundancy. The shutdown behavior of the system of FIG. 5 may include: UPS #1 and #2 on battery—run command to remotely shut down blade server and Storage/Network—(option to shutdown PowerChute Machine is not enabled), UPS #3 and #4 on battery—run command to remotely shut down blade server and Storage/Network (option to shut down PowerChute Machine is not enabled), and UPS #5 and #6 on battery—run command file to remotely shut down blade server, Storage/network (option to shut down PowerChute Machine is enabled).

Figure 6:
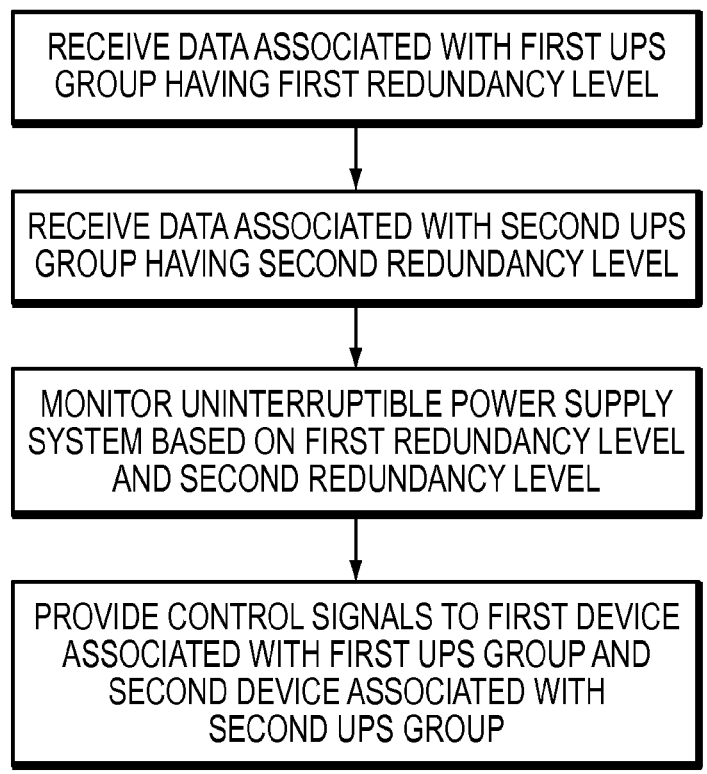
FIG. 6 is a block diagram of a method for monitoring an uninterruptible power supply system, according to one implementation.

FIG. 6 is a block diagram of a method for monitoring an uninterruptible power supply system, according to one implementation. The method 600 may implement the systems described herein. In a general overview, data associated with a first UPS group having a first redundancy level may be received (block 602). Data associated with a second UPS group having a second redundancy level may be received, which is different than the first redundancy level (block 604). The uninterruptible power supply system may be monitored based on the first redundancy level and the second redundancy level (block 606). Based on the monitoring, a command may be provided to a first device associated with the first UPS group and a second device associated with the second UPS group (block 608).

In some implementations, the data associated with the first UPS group and the second UPS group includes a UPS group name, an IP address, and a shutdown condition. The shutdown condition includes a configuration of a number of UPS's required to power the load. In some implementations, the shutdown condition includes a period of time associated with shutdown. The period of time associated with shutdown delays a shutdown of the first device associated with the first UPS group and the second device associated with the second UPS group. The shutdown condition may be assigned to the first UPS group and the second UPS group. In some implementations, the shutdown condition assigned to the first UPS group is different than the shutdown condition assigned to the second UPS group.

In some implementations, the command may control the first device associated with the first UPS group and the second device associated with the second control group. The command may shut down the first or the second device, provide further monitoring of the first or the second device, etc. In some implementations, the method 600 may further include providing the command in the form of a command file to the first UPS group or the second UPS group. The command file may issue a shutdown command to the first UPS group and the second UPS group. In another implementation, the command file resides on a control server that remotely shuts down the first or the second device associated with the first UPS group or the second UPS group, respectively.

Embodiments above have been described with regard to an improved inverter used in an online UPS. In other embodiments, inverters described herein may be used in other types of UPS's and in other types of power devices as well.

Various aspects and functions described herein in accord with the present disclosure may be implemented as hardware, software, firmware or any combination thereof. Aspects in accord with the present disclosure may be implemented within methods, acts, systems, system elements and components using a variety of hardware, software or firmware configurations. Furthermore, aspects in accord with the present disclosure may be implemented as specially-programmed hardware and/or software.

Having thus described several aspects of at least one example, it is to be appreciated that various alterations, modifications, and improvements will readily occur to those skilled in the art. Such alterations, modifications, and improvements are intended to be part of this disclosure, and are intended to be within the scope of the examples discussed herein. Accordingly, the foregoing description and drawings are by way of example only.

What is claimed is:

1. A system for monitoring a first UPS group having a first redundancy level and a second UPS group having a second redundancy level, wherein the first redundancy level is different than the second redundancy level, the system comprising:
   a graphical user interface configured to display selectable configuration settings to a user, the selectable configuration settings including the first redundancy level, the second redundancy level, and at least one shutdown condition; and
   a processing circuit configured to:
      receive selected configuration settings selected by the user;
      monitor the first UPS group and the second UPS group, the first UPS group being configured to provide power to a first device, and the second UPS group being configured to provide power to a second device; and
      based on the monitoring and the at least one shutdown condition, detect that the at least one shutdown condition has occurred and selectively provide control signals to shut down at least one of the first device and the second device based on the selected configuration settings.

2. The system of claim 1, wherein the processing circuit is further configured to provide control signals to the first UPS group and the second UPS group to continue to provide power independent of a power status of the first device and the second device.

3. The system of claim 1, wherein the processing circuit is further configured to provide control signals to power off at least one of the first UPS group and the second UPS group.

4. The system of claim 1, wherein the processing circuit is further configured to provide control signals to power off at least one of a UPS in the first UPS group and a UPS in the second UPS group.

5. The system of claim 1, wherein the selected configuration settings comprise a selection of a UPS for one of the first UPS group and the second UPS group.

6. A method for monitoring an uninterruptible power supply system, the method comprising:
   providing a graphical user interface configured to display selectable configuration settings to a user, the selectable configuration settings including at least one shutdown condition,
   data associated with a first UPS group having a first redundancy level, and
   data associated with a second UPS group having a second redundancy level, wherein the second redundancy level is different than the first redundancy level;
   receiving, at a server, selected configuration settings selected by the user;
   monitoring the uninterruptible power supply system based on the first redundancy level and the second redundancy level; and
   based on the monitoring, detecting that the at least one shutdown condition has occurred and selectively providing control signals to shut down at least one of a first device powered by the first UPS group and a second device powered by the second UPS group based on the selected configuration settings.

7. The method of claim 6,
   wherein the selected configuration settings include a configuration of the first UPS group and configuration of the second UPS group.

8. The method of claim 7, wherein the selected configuration settings include at least one of a UPS group name and an IP address for a device powered by one of the first UPS group and the second UPS group.

9. The method of claim 7, wherein the control signals control the first UPS group and the second UPS group.

10. The method of claim 9, wherein the control signals shut down the first device associated with the first UPS group and the second device associated with the second UPS group.

11. The method of claim 6, wherein the at least one shutdown condition comprises a period of time associated with shutdown.

12. The method of claim 11, wherein the period of time associated with shutdown delays a shutdown of the first device associated with the first UPS group and the second device associated with the second UPS group.

13. The method of claim 6, wherein the at least one shutdown condition is assigned to the first UPS group and the second UPS group.

14. The method of claim 13, wherein the shutdown condition assigned to the first UPS group is different than the shutdown condition assigned to the second UPS group.

15. A computer storage medium encoded with a computer program, the program comprising instructions that when executed by data processing apparatus cause the data processing apparatus to perform operations comprising:
   receiving selected configuration settings selected by a user, the selected configuration settings including at least one shutdown condition, data associated with a first UPS group of an uninterruptible power supply system having a first redundancy level, and data associated with a second UPS group of the uninterruptible power supply system having a second redundancy level;
   monitoring the uninterruptible power supply system based on the first redundancy level and the second redundancy level; and
   based on the monitoring, detecting that the at least one shutdown condition has occurred and selectively providing control signals to shut down at least one of a first device powered by the first UPS group and a second device powered by the second UPS group based on the selected configuration settings.

16. The computer storage medium of claim 15, wherein the selected configuration settings include at least one of a UPS group name and an IP address.

17. The computer storage medium of claim 15, wherein the at least one shutdown condition comprises a configuration of a number of UPS's required to power a load.

18. The computer storage medium of claim 15, wherein the at least one shutdown condition comprises a period of time associated with shutdown.

19. The computer storage medium of claim 18, wherein the period of time associated with shutdown delays a shutdown of the first device associated with the first UPS group and the second device associated with the second UPS group.

* * * * *